(12) United States Patent
Leobandung (10) Patent No.: US 11,227,212 B2
(45) Date of Patent: Jan. 18, 2022

(54) NON-VOLATILE RESISTIVE PROCESSING UNIT

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 329 days.

(21) Appl. No.: 16/377,797

(22) Filed: Apr. 8, 2019

(65) Prior Publication Data
US 2020/0320376 A1 Oct. 8, 2020

(51) Int. Cl.
*H01L 27/088* (2006.01)
*G06N 3/063* (2006.01)
*H01L 45/00* (2006.01)

(52) U.S. Cl.
CPC ....... *G06N 3/0635* (2013.01); *H01L 45/1206* (2013.01); *H01L 45/1253* (2013.01); *H01L 45/1675* (2013.01)

(58) Field of Classification Search
None
See application file for complete search history.

(56) References Cited

U.S. PATENT DOCUMENTS

| 5,530,275 | A | 6/1996 | Widdershoven |
| 8,937,292 | B2 | 1/2015 | Bateman |
| 9,064,903 | B2 | 6/2015 | Mitchell et al. |
| 9,443,982 | B1 * | 9/2016 | Balakrishnan .... H01L 29/66772 |
| 9,760,533 | B2 | 9/2017 | Fick et al. |
| 9,899,515 | B1 * | 2/2018 | Cheng ............. H01L 21/823468 |
| 2017/0287902 | A1 * | 10/2017 | Balakrishnan ........ H01L 29/045 |
| 2018/0277552 | A1 | 9/2018 | Huang et al. |

FOREIGN PATENT DOCUMENTS

EP 3121679 1/2017

OTHER PUBLICATIONS

Tayfun Gokmen et al., "Acceleration of Deep Neural Network Training with Resistive Cross-Point Devices: Design Considerations", Frontiers in Neuroscience, Jul. 2016.

* cited by examiner

*Primary Examiner* — Joseph C. Nicely
*Assistant Examiner* — Lamont B Koo
(74) *Attorney, Agent, or Firm* — Tutunjian & Bitetto, P.C.; Randall Bluestone (57) ABSTRACT

Semiconductor devices and methods of forming the same include forming a drain/gate contact, in an opening of a layer of dielectric material, that includes a portion that extends up along sidewalls of the opening. A drain layer is formed on a bottom surface of the drain/gate contact. A trapped insulator layer is formed on sidewalls of the drain/gate contact. A channel layer is formed in the opening. A source layer is formed on the channel layer.

20 Claims, 8 Drawing Sheets

FIG. 1

(Prior art)

NON-VOLATILE RESISTIVE PROCESSING UNIT

BACKGROUND

The present invention generally relates to resistive processing units and, more generally, to resistive processing units based on a floating gate architecture.

An artificial neural network (ANN) is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

Figure 1:
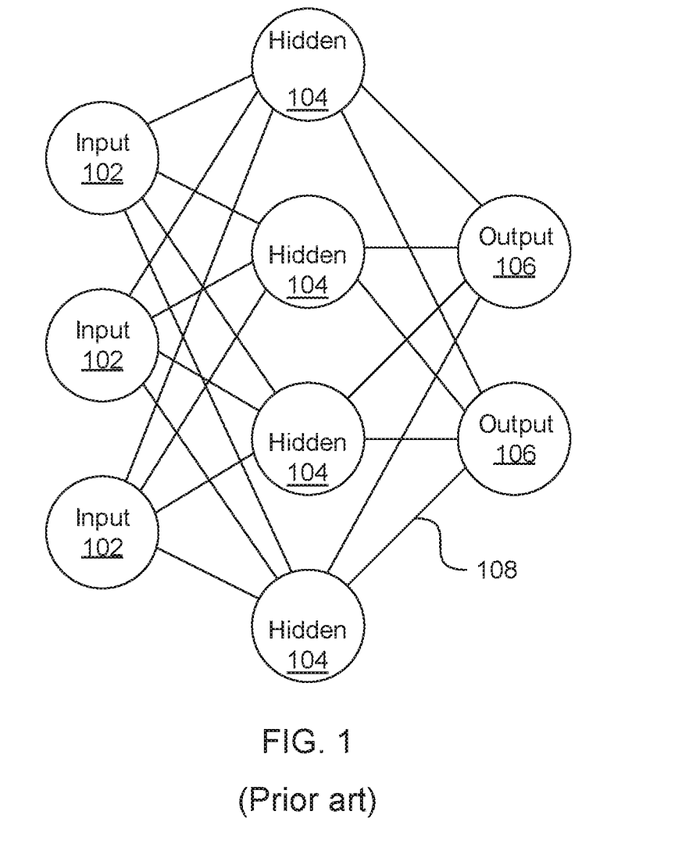
FIG. 1 is a diagram of a general neural network architecture.

Referring now to FIG. 1, a generalized diagram of a neural network is shown. ANNs demonstrate an ability to derive meaning from complicated or imprecise data and can be used to extract patterns and detect trends that are too complex to be detected by humans or other computer-based systems. The structure of a neural network is known generally to have input neurons 102 that provide information to one or more "hidden" neurons 104. Connections 108 between the input neurons 102 and hidden neurons 104 are weighted and these weighted inputs are then processed by the hidden neurons 104 according to some function in the hidden neurons 104, with weighted connections 108 between the layers. There can be any number of layers of hidden neurons 104, and as well as neurons that perform different functions. There exist different neural network structures as well, such as convolutional neural network, maxout network, etc. Finally, a set of output neurons 106 accepts and processes weighted input from the last set of hidden neurons 104.

This represents a "feed-forward" computation, where information propagates from input neurons 102 to the output neurons 106. Upon completion of a feed-forward computation, the output is compared to a desired output available from training data. The error relative to the training data is then processed in "feed-back" computation, where the hidden neurons 104 and input neurons 102 receive information regarding the error propagating backward from the output neurons 106. Once the backward error propagation has been completed, weight updates are performed, with the weighted connections 108 being updated to account for the received error. This represents just one variety of ANN.

While ANNs can be implemented in software, hardware implementations can be much more efficient, as the state of the weighted connections 108 is represented by physical properties of the network.

SUMMARY

A method of forming a semiconductor device includes forming a drain/gate contact, in an opening of a layer of dielectric material, that includes a portion that extends up along sidewalls of the opening. A drain layer is formed on a bottom surface of the drain/gate contact. A trapped insulator layer is formed on sidewalls of the drain/gate contact. A channel layer is formed in the opening. A source layer is formed on the channel layer.

A method of forming a semiconductor device includes forming a layer of dielectric material. An opening is etched in the layer of dielectric material. A drain/gate contact is formed in the opening and in contact with an underlying conductive contact formed in a substrate. The drain/gate contact includes a portion that extends up along sidewalls of the opening. A drain layer is formed on a bottom surface of the drain/gate contact. A gate dielectric layer is formed on the sidewalls of the drain/gate contact. A trapped insulator layer is formed on sidewalls of the gate dielectric layer. A channel layer is formed in the opening. A source layer is formed on the channel layer. A top conductive contact is formed on the source layer.

A semiconductor device includes a gate/drain contact, formed in an opening of a layer of dielectric material, that includes a portion that extends up along sidewalls of the opening. A drain layer is formed on a bottom surface of the drain/gate contact. A trapped insulator layer is formed on sidewalls of the drain/gate contact. A channel is formed on the drain layer. A source layer is formed on the channel.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present inventions provide an implementation for a hardware-based artificial neural network (ANN) that uses a floating gate architecture as resistive processing units (RPUs). The floating gate architecture stores charges on a trapped insulator layer, and the electric field of these charges affect the properties of a channel structure, thereby determining the resistance of the RPU. Charges can then be added to, or removed from, the trapped insulator layer to change the resistance value of the RPU.

Figure 2:
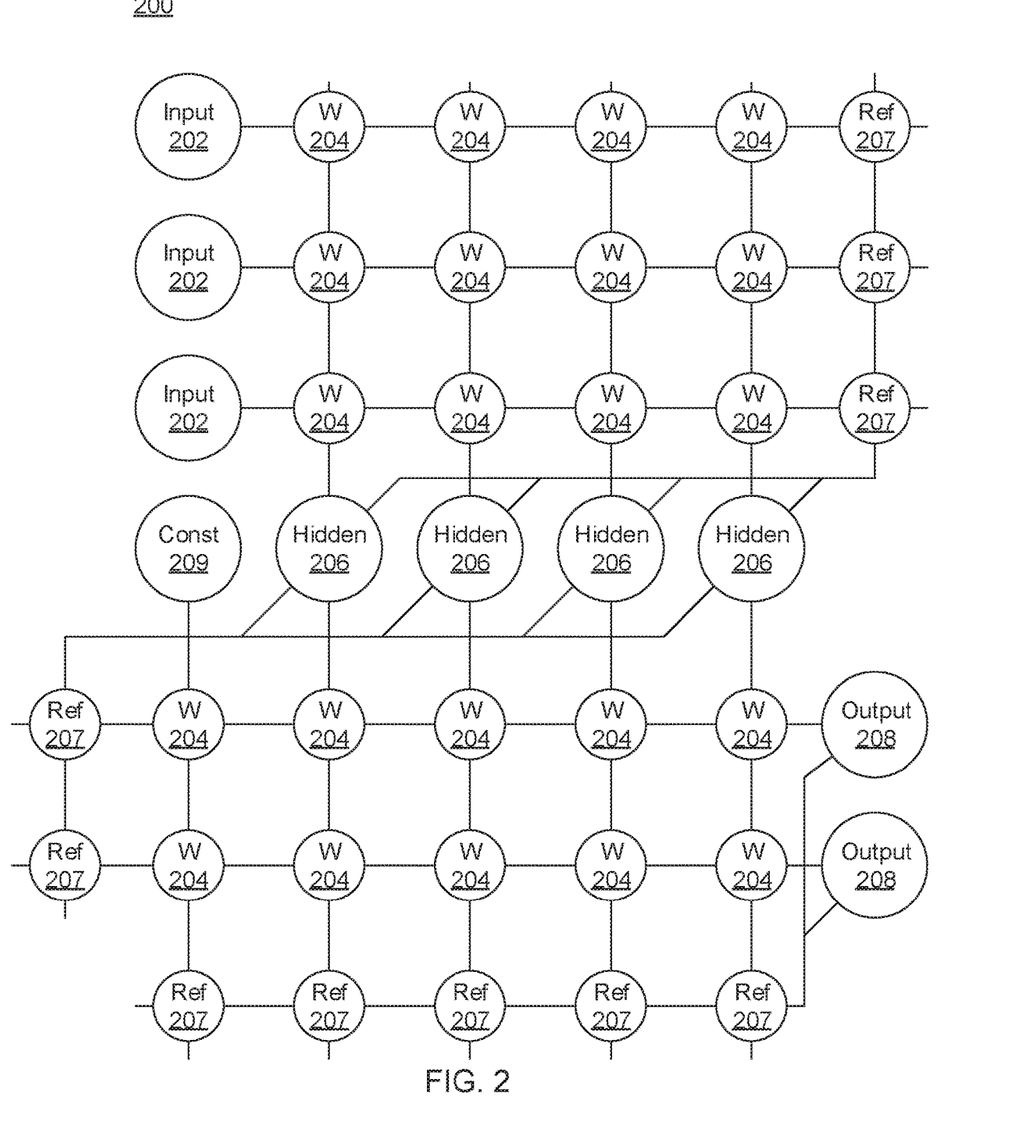
FIG. 2 is a diagram of a neural network architecture that uses resistive processing units (RPUs) as weights in accordance with an embodiment of the present invention.

Referring now to the drawings in which like numerals represent the same or similar elements and initially to FIG. 2, an ANN architecture 200 is shown. It should be understood that the present architecture is purely exemplary and that other architectures or types of neural network can be used instead. In particular, while a hardware embodiment of an ANN is described herein, it should be understood that neural network architectures can be implemented or simulated in software. The hardware embodiment described herein is included with the intent of illustrating general principles of neural network computation at a high level of generality and should not be construed as limiting in any way.

Furthermore, the layers of neurons described below and the weights connecting them are described in a general manner and can be replaced by any type of neural network layers with any appropriate degree or type of interconnectivity. For example, layers can include convolutional layers, pooling layers, fully connected layers, stopmax layers, or any other appropriate type of neural network layer. Furthermore, layers can be added or removed as needed and the weights can be omitted for more complicated forms of interconnection.

During feed-forward operation, a set of input neurons 202 each provide an input voltage in parallel to a respective row of weights 204. In the hardware embodiment described herein, the weights 204 each have a settable resistance value, such that a current output flows from the weight 204 to a respective hidden neuron 206 to represent the weighted input. In software embodiments, the weights 204 can simply be represented as coefficient values that are multiplied against the relevant neuron outputs.

Following the hardware embodiment, the current output by a given weight 204 is determined as $$I = \frac{V}{r},$$

where V is the input voltage from the input neuron 202 and r is the set resistance of the weight 204. The current from each weight adds column-wise and flows to a hidden neuron 206. A set of reference weights 207 have a fixed resistance and combine their outputs into a reference current that is provided to each of the hidden neurons 206. Because conductance values can only be positive numbers, some reference conductance is needed to encode both positive and negative values in the matrix. The currents produced by the weights 204 are continuously valued and positive, and therefore the reference weights 207 are used to provide a reference current, above which currents are considered to have positive values and below which currents are considered to have negative values. The use of reference weights 207 is not needed in software embodiments, where the values of outputs and weights can be precisely and directly obtained. As an alternative to using the reference weights 207, another embodiment can use separate arrays of weights 204 to capture negative values.

The hidden neurons 206 use the currents from the array of weights 204 and the reference weights 207 to perform some calculation. The hidden neurons 206 then output a voltage of their own to another array of weights 204. This array performs in the same way, with a column of weights 204 receiving a voltage from their respective hidden neuron 206 to produce a weighted current output that adds row-wise and is provided to the output neuron 208.

It should be understood that any number of these stages can be implemented, by interposing additional layers of arrays and hidden neurons 206. It should also be noted that some neurons can be constant neurons 209, which provide a constant output to the array. The constant neurons 209 can be present among the input neurons 202 and/or hidden neurons 206 and are only used during feed-forward operation.

During back propagation, the output neurons 208 provide a voltage back across the array of weights 204. The output layer compares the generated network response to training data and computes an error. The error is applied to the array as a voltage pulse, where the height and/or duration of the pulse is modulated proportional to the error value. In this example, a row of weights 204 receives a voltage from a respective output neuron 208 in parallel and converts that voltage into a current which adds column-wise to provide an input to hidden neurons 206. The hidden neurons 206 combine the weighted feedback signal with a derivative of its feed-forward calculation and stores an error value before outputting a feedback signal voltage to its respective column of weights 204. This back propagation travels through the entire network 200 until all hidden neurons 206 and the input neurons 202 have stored an error value.

During weight updates, the resistance values of the weights 204 are changed by appropriate voltage pulses, described in greater detail below. In this manner the weights 204 can be trained to adapt the neural network 200 to errors in its processing. It should be noted that the three modes of operation, feed forward, back propagation, and weight update, do not overlap with one another.

The weights 204 can be implemented using resistive cross point devices. Such resistive devices can have switching characteristics that have a non-linearity that can be used for processing data. The weights 204 can belong to a class of device called an RPU. The RPU devices can be implemented with resistive random access memory (RRAM), phase change memory (PCM), programmable metallization cell (PMC) memory, or any other device that has non-linear resistive switching characteristics. It is specifically contemplated that the present embodiments can be implemented as floating gate transistor devices, where the gate is shorted to the drain. Such RPU devices can also be considered as memristive systems.

Figure 3:
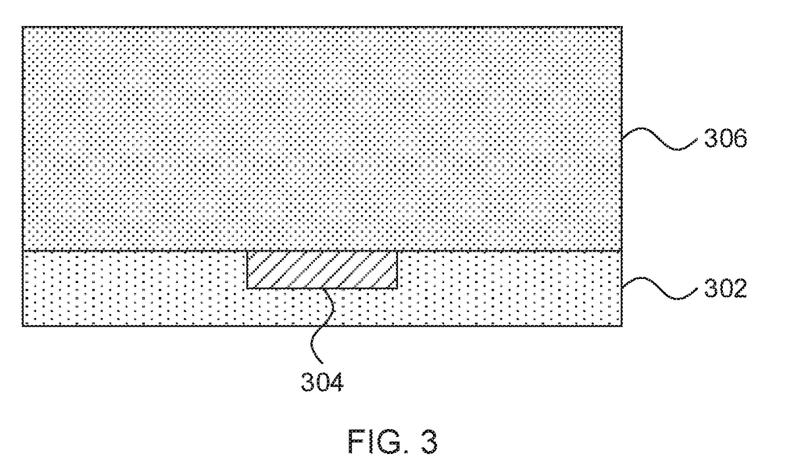
FIG. 3 is a cross-sectional diagram that shows a step in the formation of an RPU based on a floating gate architecture, where an interlayer dielectric layer is formed over a conductive contact, in accordance with an embodiment of the present invention.

Referring now to FIG. 3, a cross-sectional view of a step in the fabrication of a non volatile analog memory for an RPU is shown. It is specifically contemplated that the present embodiments can be formed as part of a back-end-of-line (BEOL) process, but it should be understood that the present embodiments can be implemented at any stage and location of chip fabrication.

A contact 304 is formed in a substrate 302. It is specifically contemplated that the substrate 302 can be a dielectric material, such a silicon dioxide layer that forms a top layer of a multi-layer chip, but it should be understood that any appropriate substrate material can be used. In some embodiments the contact 304 runs along the top of the substrate 302 to form an interconnect, as shown, while in other embodiments the contact 304 fully penetrates the substrate 302 to form a via that connects to underlying circuit structures. Substrate 302 can be any semiconductor wafer that has devices built on them, with metallization connecting those devices. The contact 304 can be formed from any appropriate conductive material. Examples of such conductive materials include, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. An interlayer dielectric 306 is formed over the substrate 302. The interlayer dielectric 306 can be formed from any appropriate dielectric material including, e.g., SiCOH, SiN, and BCN.

Figure 4:
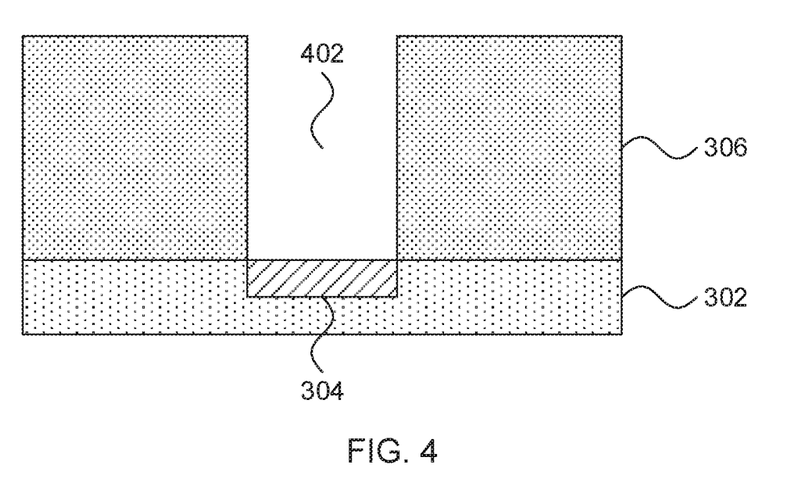
FIG. 4 is a cross-sectional diagram that shows a step in the formation of an RPU based on a floating gate architecture, where an opening is formed in the interlayer dielectric, in accordance with an embodiment of the present invention.

Referring now to FIG. 4, a cross-sectional view of a step in the fabrication of a non volatile analog memory for an RPU is shown. An opening 402 is formed in the interlayer dielectric 306 by any appropriate etching process including, e.g., photolithography, where a mask defines the area of the opening 402 using a photolithographic process and an anisotropic etch is performed. The opening 402 exposes the underlying contact 304. The anisotropic etch can include Reactive Ion Etching (RIE), which is a form of plasma etching in which the surface to be etched is placed on a radio-frequency powered electrode. During RIE, the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 5:
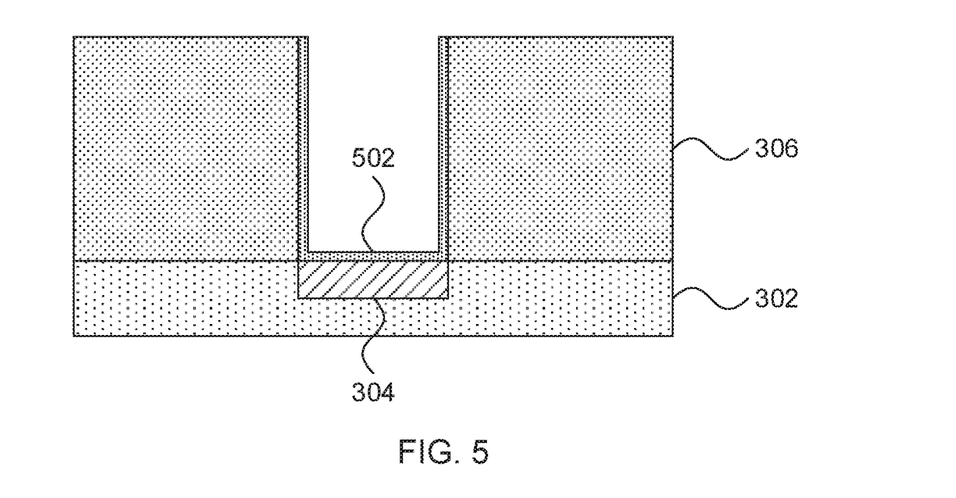
FIG. 5 is a cross-sectional diagram that shows a step in the formation of an RPU based on a floating gate architecture, where a gate/drain contact is formed in the opening, in accordance with an embodiment of the present invention.

Referring now to FIG. 5, a cross-sectional view of a step in the fabrication of a RPU is shown. A drain/gate conductor layer 502 is conformally formed in the opening 402. The drain/gate conductor layer 502 is formed from a conductive material, as described above, and can be deposited by any appropriate conformal deposition process, such as chemical vapor deposition (CVD) or atomic layer deposition (ALD). Any conductive material that is formed on top of the interlayer dielectric 306 can be removed by filling in a supporting fill material in the opening 402 and then polishing down to the level of the interlayer dielectric 306 using a chemical mechanical planarization (CMP) process. The supporting fill material can then be etched away using any appropriate etch, leaving the inner sidewalls of the drain/gate conductor layer 502 exposed.

CVD is a deposition process in which a deposited species is formed as a result of chemical reaction between gaseous reactants at greater than room temperature (25° C. to 900° C.). The solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

Atomic Layer Deposition ALD uses self-limiting surface reactions to deposit material layers in the monolayer or sub-monolayer thickness regime. ALD is similar in chemistry to chemical vapor deposition CVD, except that the ALD reaction breaks the CVD reaction into two half-reactions, keeping the precursor materials separate during the reaction. In some embodiments, the ALD process may be a thin film deposition method in which a film is grown on a substrate by exposing its surface to alternate gaseous species (referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

CMP is performed using, e.g., a chemical or granular slurry and mechanical force to gradually remove upper layers of the device. The slurry may be formulated to be unable to dissolve, for example, the interlayer dielectric 306, resulting in the CMP process's inability to proceed any farther than that layer.

Figure 6:
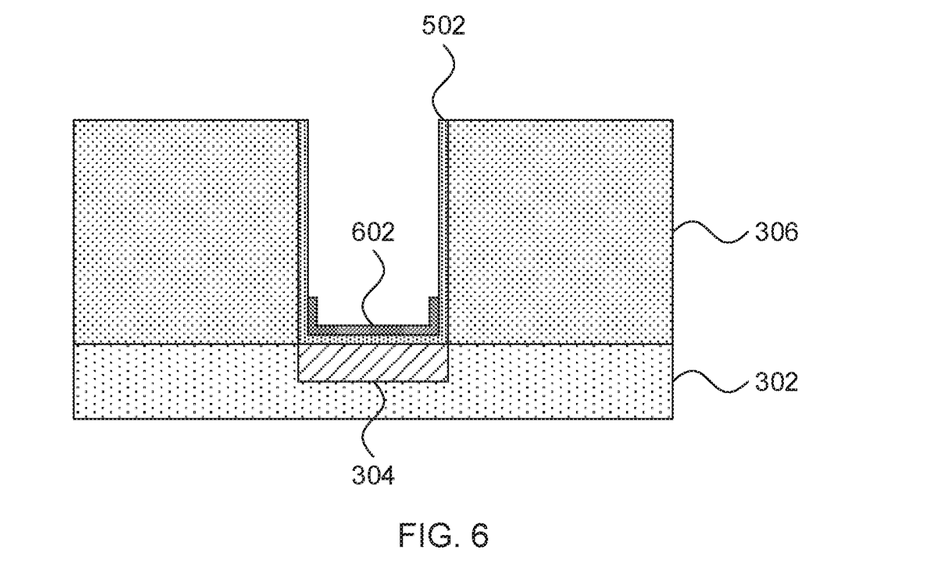
FIG. 6 is a cross-sectional diagram that shows a step in the formation of an RPU based on a floating gate architecture, where a drain layer is formed on the gate/drain contact, in accordance with an embodiment of the present invention.

Referring now to FIG. 6, a cross-sectional view of a step in the fabrication of a non volatile analog memory for an RPU is shown. A bottom drain region 602 is formed on the gate/drain contact 502. It is specifically contemplated that the bottom drain region 602 can be formed from a doped semiconductor material, such as n-type doped silicon, but any appropriate dopant and semiconductor material can be used instead. In particular, it is specifically contemplated that a p-dopant can be used instead of an n-type dopant according to the conductivity type of the device.

The bottom drain region 602 can be formed by conformally depositing the doped semiconductor material over the gate/drain contact 502. A protective fill material is deposited into the opening 402 and is then etched back to an appropriate height that defines the height of the sidewalls of the bottom drain region 602. Any exposed doped semiconductor material is etched away using an appropriate isotropic etch, leaving a layer at the bottom of the opening 402. The protective fill material can then be etched away.

Figure 7:
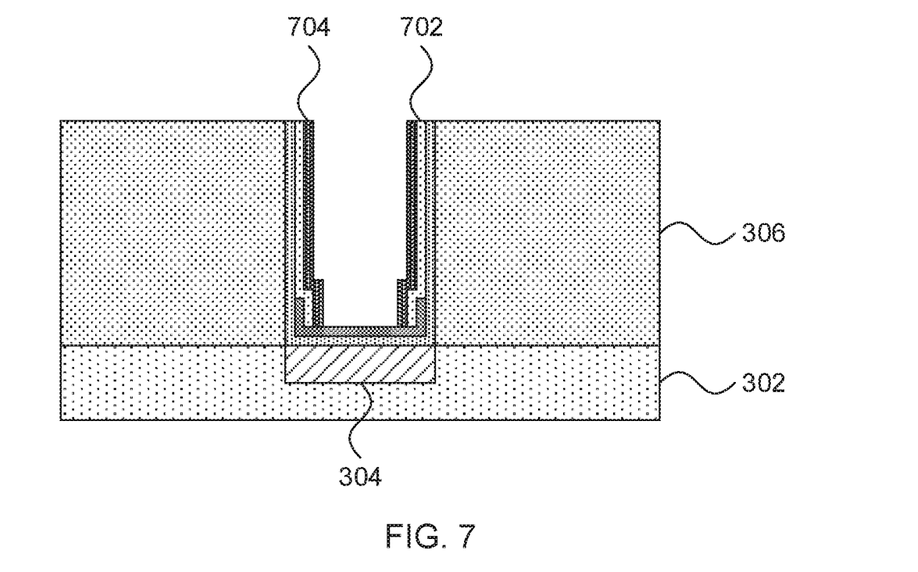
FIG. 7 is a cross-sectional diagram that shows a step in the formation of an RPU based on a floating gate architecture, where a gate dielectric and a trapped insulator layer are formed on the gate/drain contact and the drain layer, in accordance with an embodiment of the present invention.

Referring now to FIG. 7, a cross-sectional view of a step in the fabrication of a non volatile analog memory for an RPU is shown. A gate dielectric layer 702 and a trapped insulator layer 704 are conformally deposited in the opening 402 over the drain/gate contact 502 and the bottom drain region 602. Any material from the gate dielectric layer 702 and trapped insulator layer 704 that is formed on horizontal surfaces is etched away using an anisotropic etch.

It is specifically contemplated that the gate dielectric layer 702 can be formed from silicon dioxide, but any appropriate dielectric material can be used instead, including high-k dielectrics and low-k dielectrics. It is specifically contemplated that the trapped insulator layer 704 can be formed from silicon oxynitride, but any other appropriate insulating material that will hold charges can be used instead. Although the gate dielectric layer 702 is shown as being deposited first, and the trapped insulator layer 704 second, the order of deposition can be reversed in some embodiments.

Figure 8:
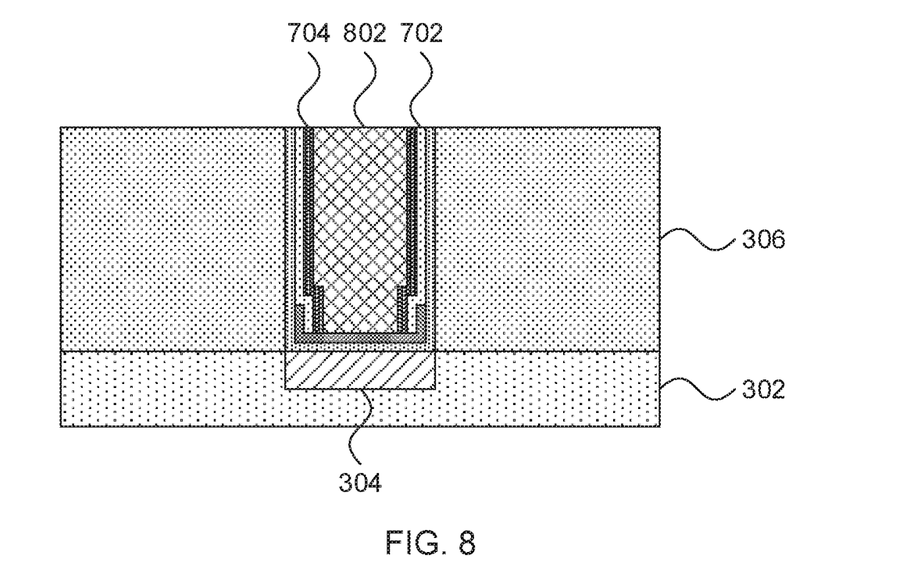
FIG. 8 is a cross-sectional diagram that shows a step in the formation of an RPU based on a floating gate architecture, where a channel structure is formed in the opening, in accordance with an embodiment of the present invention.

Referring now to FIG. 8, a cross-sectional view of a step in the fabrication of a non volatile analog memory for an RPU is shown. A layer of channel material 802 is formed to fill the opening 402. It is specifically contemplated that the layer of channel material 802 can be formed from undoped polysilicon, but any appropriate semiconductor material can be used instead. Exemplary semiconductor materials include, for example, silicon, germanium, silicon germanium, carbon-doped silicon, and carbon-doped silicon germanium. Other types of semiconductor materials, such as III-V semiconductor materials, can be used as well. The layer of channel material 802 can be formed by any appropriate deposition process, such as CVD, and can then be planarized down to the level of the interlayer dielectric 306 using, e.g., CMP.

Figure 9:
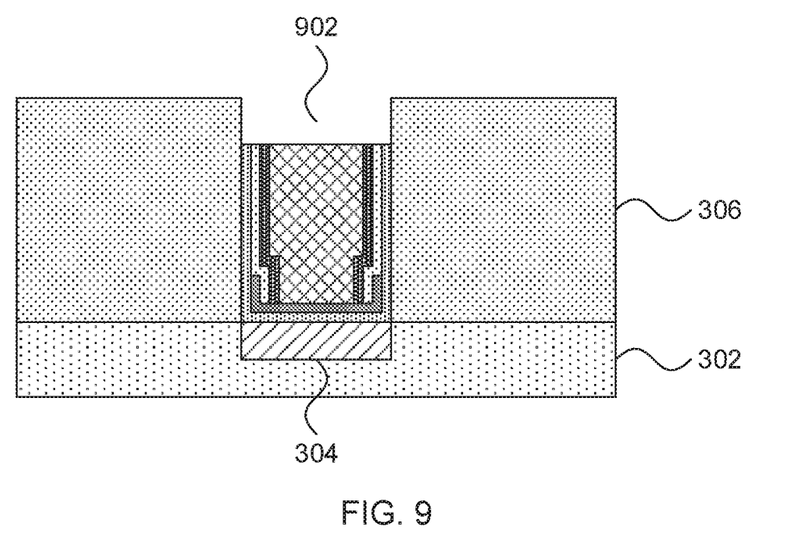
FIG. 9 is a cross-sectional diagram that shows a step in the formation of an RPU based on a floating gate architecture, where the channel is recessed relative to the interlayer dielectric, in accordance with an embodiment of the present invention.

Referring now to FIG. 9, a cross-sectional view of a step in the fabrication of a non volatile analog memory for an RPU is shown. The layer of channel material 802, the trapped insulator 704, the gate dielectric 702, and the gate/drain conductor layer 502 are recessed using one or more appropriate anisotropic etch processes. A selective etch is used that preferentially removes material from these layers relative to the material of the interlayer dielectric 306, forming a recess 902.

Figure 10:
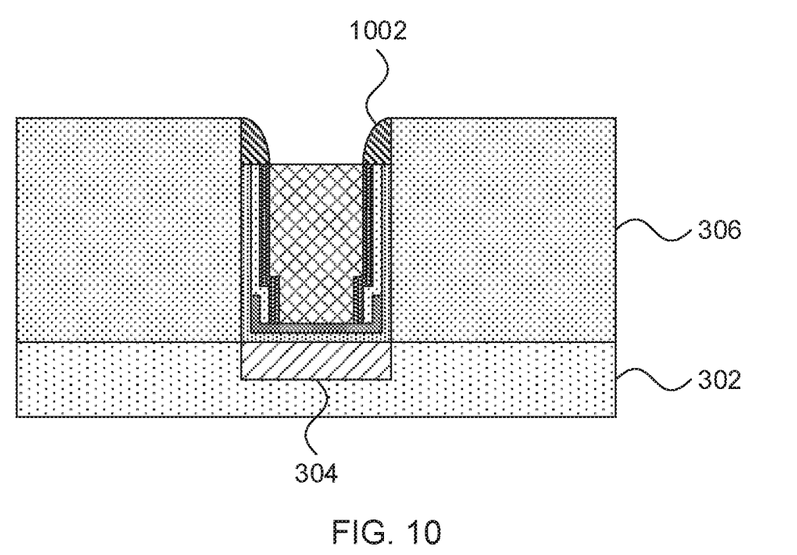
FIG. 10 is a cross-sectional diagram that shows a step in the formation of an RPU based on a floating gate architecture, where dielectric sidewalls are formed in the recess, in accordance with an embodiment of the present invention.

Referring now to FIG. 10, a cross-sectional view of a step in the fabrication of a non volatile analog memory for an RPU is shown. Sidewalls 1002 are formed from any appropriate dielectric material, such as silicon nitride. The sidewalls 1002 can be formed by conformally depositing the dielectric material and then selectively anisotropically etching the dielectric material from horizontal surfaces.

Figure 11:
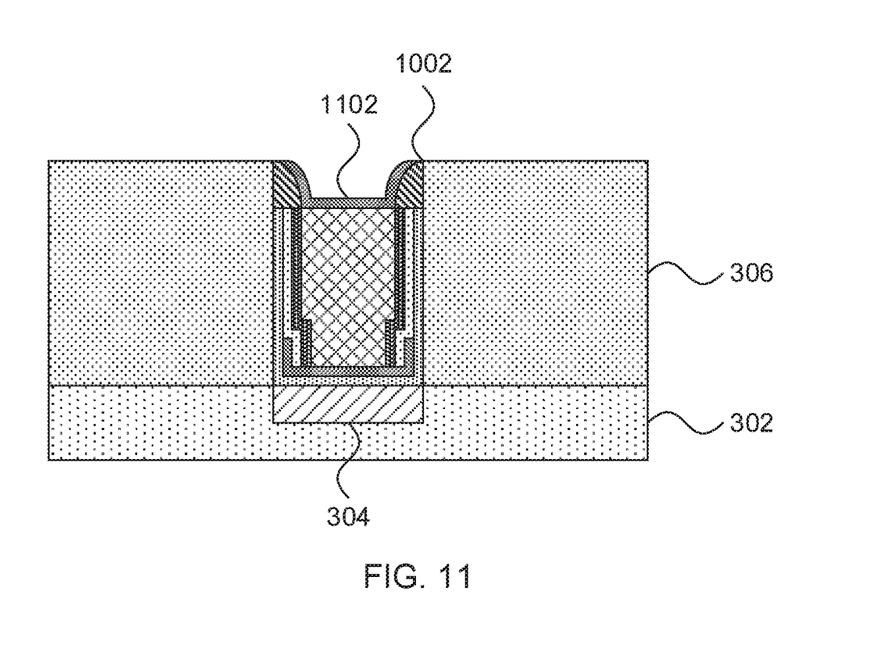
FIG. 11 is a cross-sectional diagram that shows a step in the formation of an RPU based on a floating gate architecture, where a source layer is formed in the recess, in accordance with an embodiment of the present invention.

Referring now to FIG. 11, a cross-sectional view of a step in the fabrication of a non volatile analog memory for an RPU is shown. A top source region 1102 is formed in the recess 902, over the sidewalls 1002. The top source region 1102 can be formed from a layer of doped semiconductor material, such as n+ doped polysilicon, and can then be polished down to the level of the top surface of the interlayer dielectric 306. It should be understood that the top source region 1102 can be formed from the same material as the bottom source region 602 or can be formed from another material having the same dopant polarity.

Figure 12:
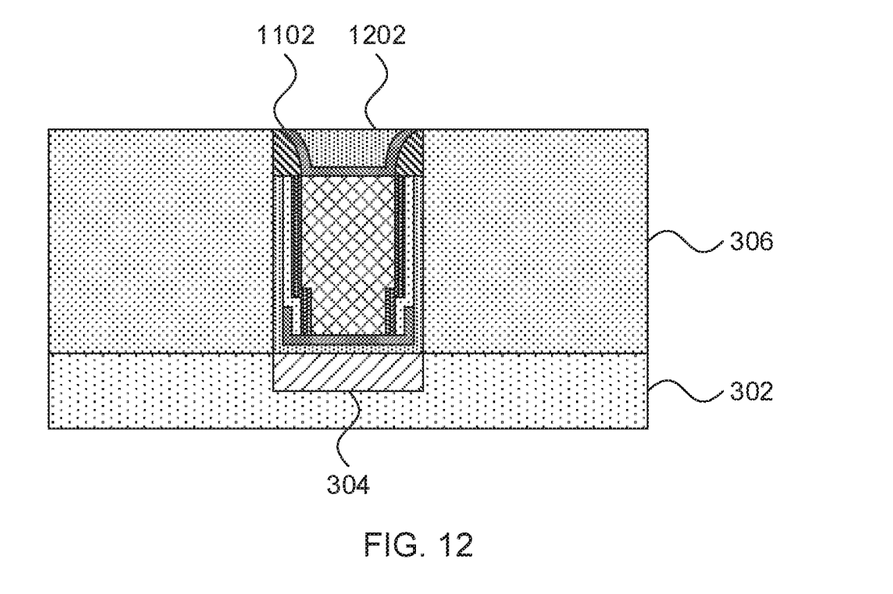
FIG. 12 is a cross-sectional diagram that shows a step in the formation of an RPU based on a floating gate architecture, where a conductive contact is formed in the recess, in accordance with an embodiment of the present invention.

Referring now to FIG. 12, a cross-sectional view of a step in the fabrication of a non volatile analog memory for an RPU is shown. A top source conductive contact 1202 is formed by depositing a conductive material and then polishing down to the level of the interlayer dielectric 306. The top source conductive contact 1202 can be formed by any appropriate deposition process and can comprise any appropriate conductive material.

When a voltage is applied to the drain/gate contact 502, the device can inject electrons to the trapped insulator 704, can remove electrons from the trapped insulator 704, or can provide a readout current. When a voltage that is above a threshold value, either positive or negative, is applied between the top source conductor contact 1202 and the gate/drain contact 502, electrons will tunnel between the gate/drain contact 502 and the trapped insulator 704, through the gate dielectric layer 702. The presence of these electrons establishes a static voltage within the device that affects the resistance of the device when a below-threshold voltage is applied.

It should be noted that a current will also flow when an above-threshold voltage is applied. However, because the voltage will be applied across the entire gate/drain contact 502, including the portions that run vertically alongside the trapped insulator 704, at least some current can flow to or from the trapped insulator 704.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "below," "lower" "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other e rets or features. Thus, the term "below" can encompass both an ion of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 13:
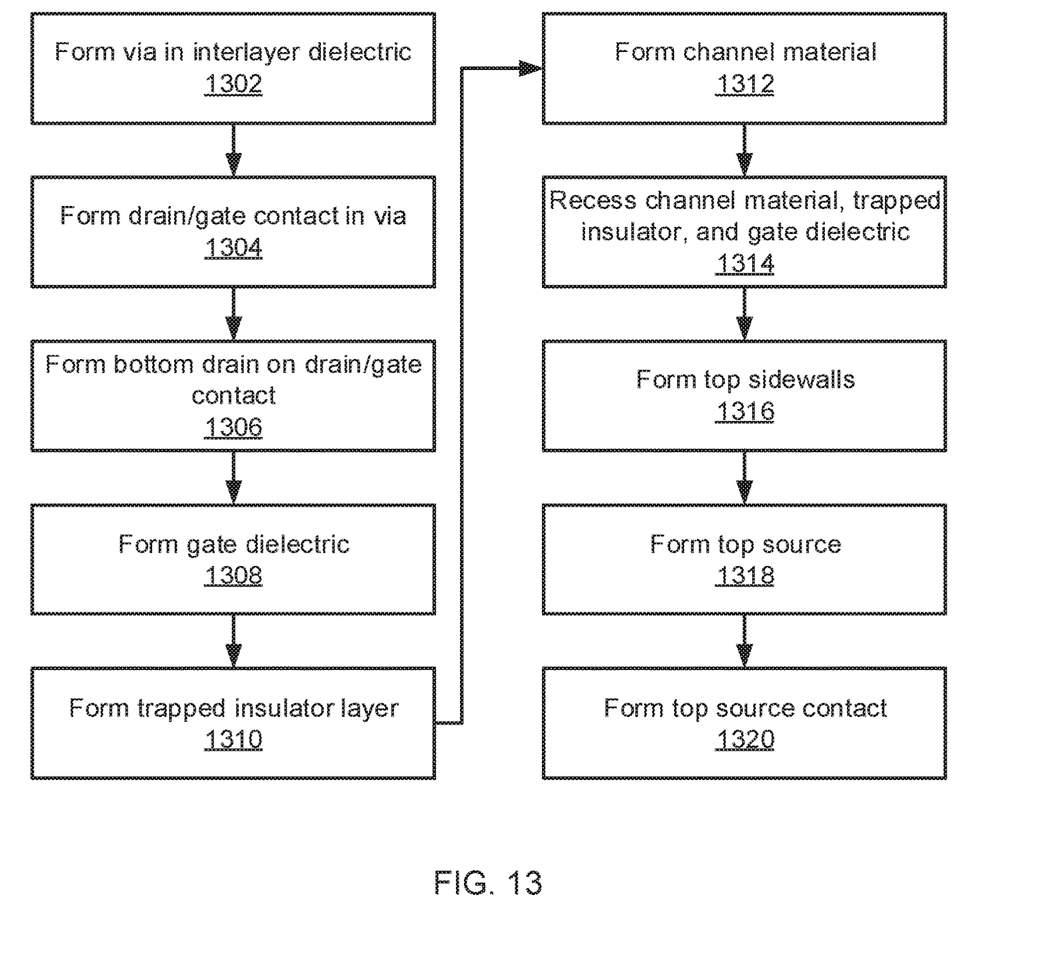
FIG. 13 is a block/flow diagram of a process of forming an RPU based on a floating gate architecture in accordance with an embodiment of the present invention.

Referring now to FIG. 13, a method for forming a resistive processing unit is shown. Block 1302 forms a via 402 in an interlayer dielectric 306, using any appropriate isotropic etch, to expose a contact 304. Block 1304 forms a drain/gate contact 502 along surfaces of the via 402 by any appropriate conformal deposition process using a conductive material. Block 1306 forms the bottom drain structure 602 on the drain/gate contact 502 using a conformal deposition process followed by a dummy fill and etchback that shortens the height of the bottom drain structure 602. The bottom drain structure 602 is formed from any appropriate doped semiconductor material, including for example n-type doped silicon.

Block 1308 forms a gate dielectric layer 702 on the sidewalls of the via 402 by a conformal deposition process. Block 1310 forms the trapped insulator 704 on the gate dielectric layer 702 by a conformal deposition process. The material of these two layers is then etched away from horizontal surfaces by any appropriate anisotropic etch. It should be understood that the layers may be etched individually or in a single etch that selectively removes material from both, without damaging the underlying bottom drain 502. The gate dielectric layer 702 can be formed from any appropriate dielectric material, such as silicon dioxide, and the trapped insulator layer 704 can be formed from, e.g., silicon oxynitride.

Block 1312 deposits channel material 802 in the remaining space of the via 402 using any appropriate deposition process. It is specifically contemplated that undoped polysilicon can be used for the channel material, but it should be understood that any appropriate semiconductor material can be used instead. Block 1314 recesses the channel material 802, the trapped insulator layer 704, the gate dielectric layer 702, and the drain/gate contact 502 to form recess 902 using any appropriate selective etch or a combination of selective etches.

Block 1316 forms top sidewalls 1002 on the sides of the recess 902 using a conformal deposition of, e.g., silicon nitride, followed by a selective anisotropic etch that removes the material from horizontal surfaces. Block 1318 then forms a top source region 1102 by conformally depositing a layer of doped semiconductor material and polishing down to the level of the interlayer dielectric 306 using, e.g., a CMP process. Block 1320 then forms a top source contact 1202 by depositing a layer of conductive material using any appropriate deposition process and polishing down to the level of the interlayer dielectric using, e.g., a CMP process.

Having described preferred embodiments of a non-volatile resistive processing unit (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
   forming a drain/gate contact, in an opening of a layer of dielectric material, that includes a portion that extends up along sidewalls of the opening;
   forming a drain layer on a bottom surface of the drain/gate contact;

forming a trapped insulator layer on sidewalls of the drain/gate contact;
forming a channel layer in the opening; and
forming a source layer on the channel layer.

2. The method of claim 1, further comprising forming a gate dielectric layer on the sidewalls of the drain/gate contact before forming the trapped insulator layer.

3. The method of claim 1, further comprising recessing the channel layer, the trapped insulator layer, and the drain/gate contact to form a recess before forming the source layer.

4. The method of claim 3, further comprising forming a dielectric layer on sidewalls of the recess before forming the source layer.

5. The method of claim 1, wherein the trapped insulator layer is formed from silicon oxynitride.

6. The method of claim 1, wherein the drain/gate contact is formed in contact with an underlying conductive contact formed in a substrate.

7. The method of claim 6, further comprising forming the layer of dielectric material and etching the opening in the layer of dielectric material.

8. The method of claim 1, wherein forming the drain layer comprises forming drain layer portions that extend up along sidewalls of the drain/gate contact.

9. The method of claim 8, wherein forming the drain layer comprises:
conformally forming a layer of doped semiconductor material on surfaces of the drain/gate contact;
forming a fill material in the opening;
recessing the fill material below a height of the dielectric layer;
etching back the layer of doped semiconductor material to remove any doped semiconductor material that is not protected by the recessed fill material; and
etching away the recessed fill material.

10. The method of claim 1, further comprising forming a top conductive contact on the source layer.

11. A method of forming a semiconductor device, comprising:
forming a layer of dielectric material;
etching an opening in the layer of dielectric material;
forming a drain/gate contact, in the opening and in contact with an underlying conductive contact formed in a substrate, that includes a portion that extends up along sidewalls of the opening;
forming a drain layer on a bottom surface of the drain/gate contact;
forming a gate dielectric layer on the sidewalls of the drain/gate contact;
forming a trapped insulator layer on sidewalls of the gate dielectric layer;
forming a channel layer in the opening;
forming a source layer on the channel layer; and
forming a top conductive contact on the source layer.

12. The method of claim 11, further comprising recessing the channel layer, the trapped insulator layer, and the drain/gate contact to form a recess before forming the source layer and forming a dielectric layer on sidewalls of the recess before forming the source layer.

13. The method of claim 11, wherein forming the drain layer comprises forming drain layer portions that extend up along sidewalls of the drain/gate contact.

14. The method of claim 13, wherein forming the drain layer comprises:
conformally forming a layer of doped semiconductor material on surfaces of the drain/gate contact;
forming a fill material in the opening;
recessing the fill material below a height of the dielectric layer;
etching back the layer of doped semiconductor material to remove any doped semiconductor material that is not protected by the recessed fill material; and
etching away the recessed fill material.

15. A semiconductor device, comprising:
a gate/drain contact, formed in an opening of a layer of dielectric material, that includes a portion that extends up along sidewalls of the opening;
a drain layer above the drain/gate contact;
a trapped insulator layer on sidewalls of the drain/gate contact;
a channel on the drain layer; and
a source layer on the channel.

16. The semiconductor device of claim 15, wherein the drain layer includes a portion that extends up along sidewalls of the gate/drain contact.

17. The semiconductor device of claim 15, further comprising recess sidewalls, formed above the gate/drain contact, wherein the source layer is formed on the recess sidewalls.

18. The semiconductor device of claim 15, further comprising a top contact on the source layer.

19. The semiconductor device of claim 15, further comprising a gate dielectric layer formed between the gate/drain contact and the trapped insulator layer.

20. The semiconductor device of claim 15, wherein a portion of the gate dielectric layer is directly between sidewalls of the trapped insulator layer and the drain layer.

* * * * *